United States Patent
Inoue (10) Patent No.: US 7,960,837 B2
(45) Date of Patent: Jun. 14, 2011

(54) SEMICONDUCTOR PACKAGE

(75) Inventor: Hidetoshi Inoue, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 245 days.

(21) Appl. No.: 12/330,935

(22) Filed: Dec. 9, 2008

(65) Prior Publication Data
US 2009/0152731 A1 Jun. 18, 2009

(30) Foreign Application Priority Data
Dec. 12, 2007 (JP) ................. 2007-320489

(51) Int. Cl.
*H01L 23/48* (2006.01)
(52) U.S. Cl. .... 257/773; 257/734; 257/786; 257/E23.02
(58) Field of Classification Search .................. 257/772, 257/786, E23.015, E23.02, E23.023, E23.079, 257/678–733, 778–785
See application file for complete search history.

(56) References Cited

U.S. PATENT DOCUMENTS

| | | | | |
|---|---|---|---|---|
| 6,118,670 | A * | 9/2000 | Radford et al. | 361/777 |
| 6,177,733 | B1 * | 1/2001 | Obara | 257/786 |
| 6,531,782 | B1 * | 3/2003 | Jones et al. | 257/773 |
| 7,417,309 | B2 * | 8/2008 | Takahashi et al. | 257/687 |
| 2008/0185735 | A1 * | 8/2008 | Pham et al. | 257/778 |

FOREIGN PATENT DOCUMENTS
JP 6-79147 11/1994
* cited by examiner

*Primary Examiner* — Jasmine J Clark
(74) *Attorney, Agent, or Firm* — Rankin, Hill & Clark LLP (57) ABSTRACT

In a semiconductor package, at least two of connection pads are formed into different-shape pads which are different in planar shape from other connection pads, and one different-shape pad and another different-shape pad are disposed in a manner that, when the position of the one different-shape pad is rotated about the center point of the semiconductor package, the position does not coincide with the disposition position of the other different-shape pad.

7 Claims, 9 Drawing Sheets

SEMICONDUCTOR PACKAGE

TECHNICAL FIELD

The present disclosure relates to a semiconductor package.

RELATED ART

As a structure for stacking semiconductor packages, a so-called POP (Package On Package) structure is known. Recently, downsizing of a semiconductor package is advanced, and wiring patterns and connection pads formed in a semiconductor package are miniaturized, so that it is very difficult to independently dispose alignment marks for positioning a lower or mounting semiconductor package and an upper or mounted semiconductor package, between wiring patterns or connection pads.

It has been proposed in Patent Reference 1 that, in order to know the bonding position in a wire bonding of an IC chip or the like, specific second pads are formed into a shape which is different from that of other second pads, thereby providing the specific second pads with a function of an alignment mark.

[Patent Reference 1] JP-UM-A-6-79147

Alignment marks disposed in a semiconductor package are often disposed on a planar diagonal line of the semiconductor package because the position accuracy can be enhanced by ensuring the axis-to-axis distance of the marks. In the case where alignment marks are disposed on a diagonal line in this way, there arise problems such as that, when a semiconductor package in which the alignment marks are formed is rotated by 180 degrees, the alignment marks overlap with each other and cannot be identified. Therefore, indication of positional deviation by the alignment marks is not performed, and a semiconductor package having a stacked structure or the POP structure becomes defective.

Furthermore, it may be contemplated that many alignment marks are disposed in a semiconductor package, and a correct alignment process is performed. However, there is a problem that the time period required for a work of checking the alignment marks is prolonged, and hence such a configuration is not practically used.

SUMMARY

Exemplary embodiments of the present invention provide a semiconductor package in which the axis-to-axis distance of alignment marks disposed in the semiconductor package can be maintained to a degree similar to that in the related art, and occurrence/non-occurrence of a 180-degree rotation in a horizontal plane of the semiconductor package in which the alignment marks are formed can be surely detected while suppressing the number of the alignment marks to the minimum value.

The semiconductor package of the invention is a semiconductor package comprising three or more connection pads, at least two of connection pads being formed into different-shape pads different in planar shape from other connection pads, and one of the different-shape pads and another one of the different-shape pads are disposed in a manner that, in a mutual positional relationship of a planar arrangement, when a position of the one different-shape pad is rotated by 180 degrees about a center point of the semiconductor package, the position does not completely coincide with an initial position of the other different-shape pad.

Furthermore, the one different-shape pad and the other different-shape pad may be disposed in a manner that, when the position of the one different-shape pad is rotated by 180 degrees about the center point of the semiconductor package, a position of a center point of the one different-shape pad is displaced from a position of a center point of the other different-shape pad. Also in the positional relationship, it is possible to know the rotation state of the semiconductor package, and the different-shape pads partly overlap with each other. Therefore, a visual check is facilitated. This is advantageous.

Furthermore, the one different-shape pad and the other different-shape pad may be disposed in a manner that, when the position of the one different-shape pad is rotated by 180 degrees about the center point of the semiconductor package, a position of a center point of the one different-shape pad coincides with a position of a center point of the other different-shape pad, and an outline of the one different-shape pad is different from an outline of the other different-shape pad. Also in the positional relationship, it is possible to know the rotation state of the semiconductor package, and the different-shape pads partly overlap with each other. Therefore, a visual check is facilitated. This is advantageous.

Moreover, the semiconductor package may further comprise a second different-shape pad which is used as a visual mark for checking a position of the semiconductor package, and which is formed into a shape that is different from the planar shape of the connection pads. According to the configuration, the operator can directly visually check the mark, and hence a double check is enabled.

According to the semiconductor package of the invention, it is possible to provide a semiconductor package in which occurrence of a 180-degree rotation in a horizontal plane of the semiconductor package in which alignment marks are formed can be detected while suppressing the number of alignment marks to be disposed in the semiconductor package, to the minimum value. Namely, it is possible to provide a semiconductor package which is excellent in productivity, and which can improve the yield of a semiconductor package of the POP structure.

Other features and advantages may be apparent from the following detailed description, the accompanying drawings and the claims.

DETAILED DESCRIPTION

First Embodiment

Figure 1A:
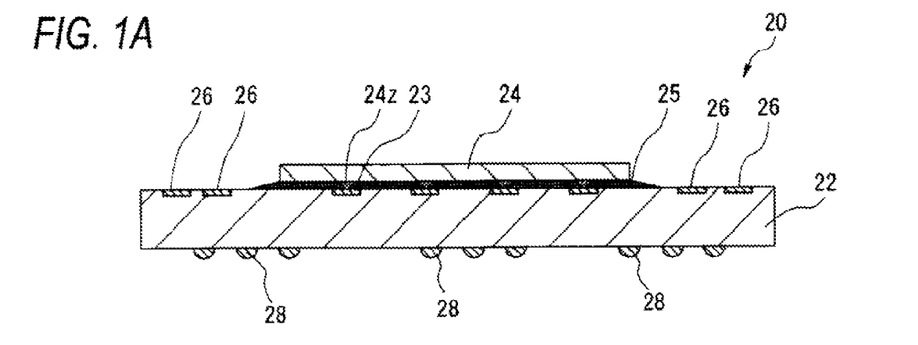
FIG. 1A is a front section view of a mounting semiconductor package in a semiconductor package of the POP structure in a first embodiment.
Figure 1B:
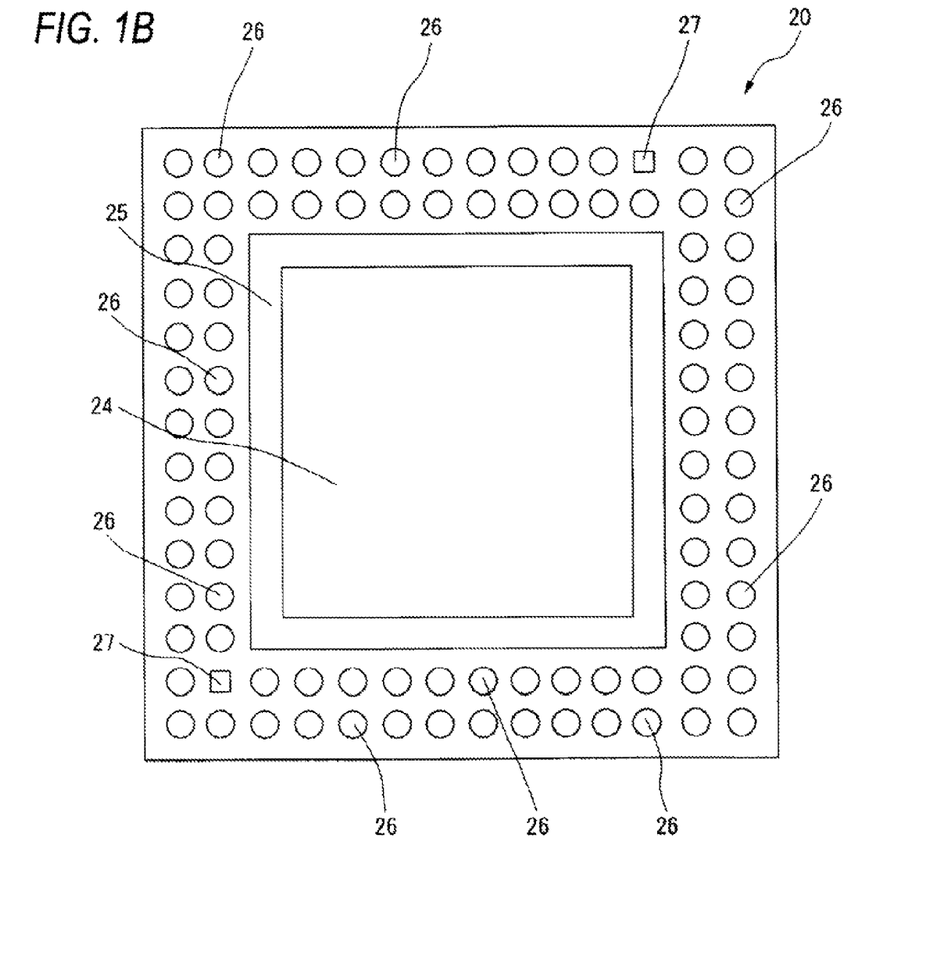
FIG. 1B is a plan view of the mounting semiconductor package in the semiconductor package of the POP structure in the first embodiment.
Figure 2A:
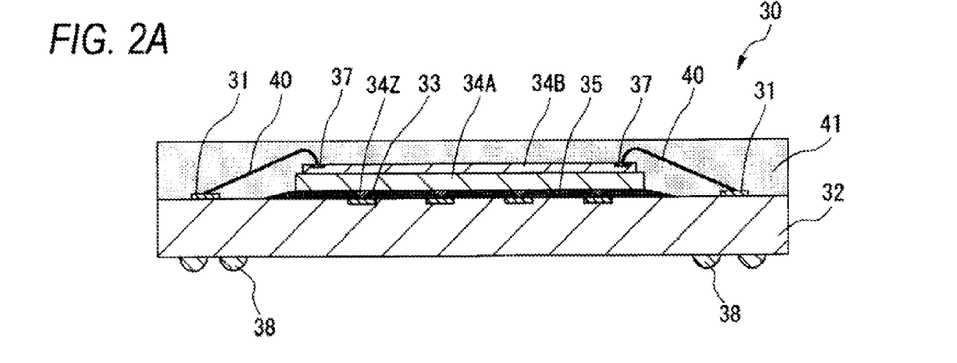
FIG. 2A is a front section view of a mounted semiconductor package in the semiconductor package of the POP structure in the first embodiment.
Figure 2B:
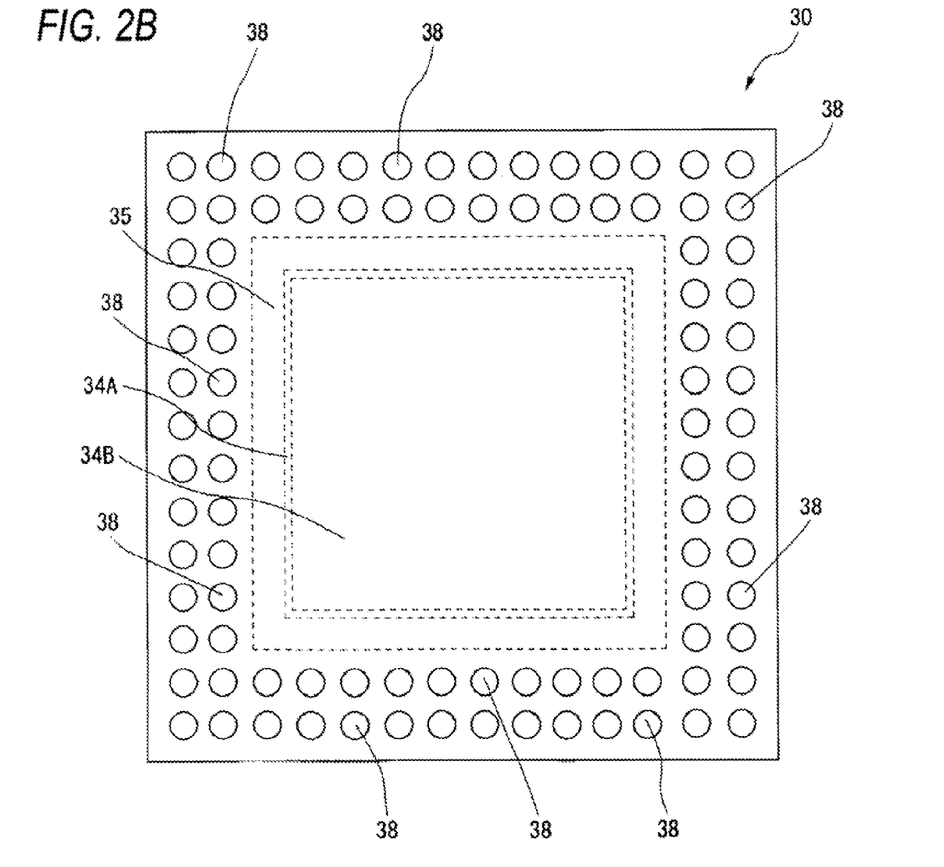
FIG. 2B is a bottom plan view of the mounted semiconductor package in the semiconductor package of the POP structure in the first embodiment.

Hereinafter, embodiments of the semiconductor package of the invention, and a semiconductor package of the POP structure in which the semiconductor package is used will be described with reference to the accompanying drawings. FIGS. 1A and 1B show a front section view and plan view of a mounting semiconductor package in a semiconductor package of the POP structure in a first embodiment. FIGS. 2A and 2B show a front section view and bottom plan view of a mounted semiconductor package in the semiconductor package of the POP structure in the first embodiment.

Figure 3:
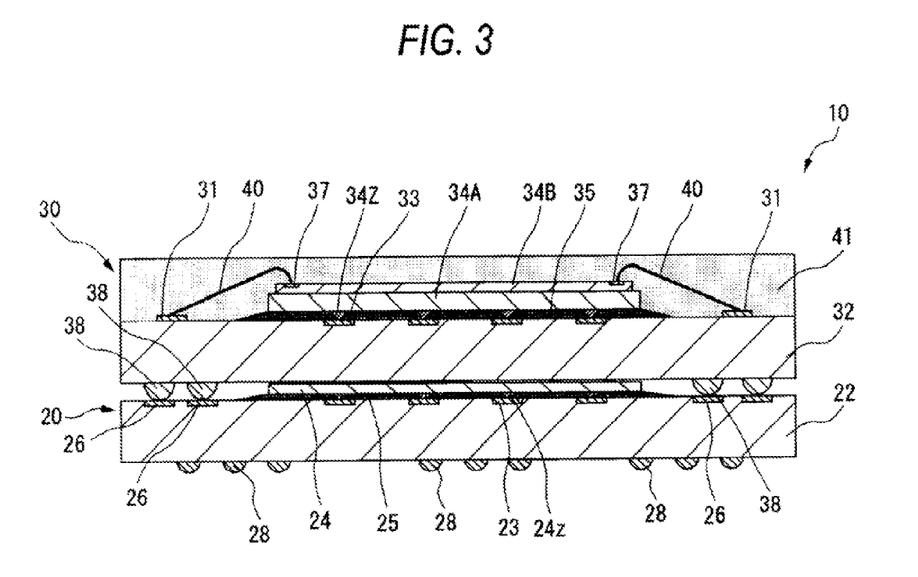
FIG. 3 is a front section view of the semiconductor package of the POP structure in the first embodiment.

In the specification, the mounting semiconductor package in the semiconductor package 10 (FIG. 3) of the POP structure is referred to as the lower package 20, and the mounted semiconductor package is referred to as the upper package 30.

In the lower package 20, as shown in FIG. 1A, electrodes 24Z (gold bumps, solder bumps, or the like) of a semiconductor device 24 are connected to pads 23 formed on the upper face of a circuit board 22 by flip-chip bonding. The gap (junction portion) between the upper face of the circuit board 22 and the lower face of the semiconductor device 24 is filled with an underfil resin 25. The flip-chip bonding is a known method, and hence a detailed description thereof will be omitted.

Connection pads 26 for connecting the lower package 20 to the upper package 30 are formed on the upper face (the face on which the upper package 30 is to be mounted) of the circuit board 22. The connection pads 26 are arranged in two rows in an arrangement surrounding the outer peripheral edge of the semiconductor device 24. In the connection pads 26, at least two connection pads (27, 27) are formed into a planar shape which is different from that of the other connection pads 26. In the specification, the connection pads which are different in planar shape from the other connection pads 26 are referred to as the different-shape pads 27.

In the embodiment, as shown in FIG. 1B, the planar shape of the connection pads 26 is formed into a circular shape, and that of the different-shape pads 27 is formed into a rectangular shape. The one different-shape pad 27 and the other different-shape pad 27 are disposed in a manner that, when the position of the one different-shape pad 27 is rotated by 180 degrees about the center point of the lower package 20, the position does not completely coincide with the initial position of the other different-shape pad 27.

In essence, a positional relationship of the planar arrangement of the one and other different-shape pads 27 is requested to be set so that a line connecting the center point of the one different-shape pad 27 and that of the other different-shape pad 27 does not pass the center point of the lower package 20. Namely, a positional relationship of disposed positions of the one and other different-shape pads 27 is formed so that, when the one different-shape pad 27 is rotated by 180 degrees about the center point of the lower package 20, the center points of the different-shape pads 27, 27 are displaced from each other even when the one different-shape pad 27 partially overlaps with the other different-shape pad 27.

The connection pads 26 and the different-shape pads 27 can be simultaneously formed in the following manner. Formation of wiring patterns of copper or the like on the upper surface of the circuit board 22, application of a solder resist to the whole surfaces of the wiring patterns, application of a photoresist to the surface of the solder resist, exposure through a pattern mask, and developing of the photoresist are performed. Thereafter, the solder resist is etched away from opening portions of the photoresist.

When the pattern mask is once formed, therefore, the related-art technique can be applied, and hence the production cost is not increased even when the connection pads 26 and the different-shape pads 27 mixedly exist. Although not shown, preferably, a surface treatment such as gold plating is applied to exposed faces of the connection pads 26 and the different-shape pads 27.

External connection terminals 28 each configured by a solder ball or the like are formed on the lower face of the circuit board 22. The external connection terminals 28 are disposed in an arrangement which enables BGA connection to a mounting board (not shown) or the like.

As shown in FIG. 2A, the upper package 30 is configured by: connecting electrodes 34Z (gold bumps, solder bumps, or the like) of a first semiconductor device 34A to pads 33 formed on the upper face of a circuit board 32 by flip-chip bonding; filling the gap between the upper face of the circuit board 32 and the first semiconductor device 34A with a underfil resin 35; then bonding a second semiconductor device 34B onto the first semiconductor device 34A by an adhesive agent; connecting between electrodes 37 formed on the upper face of the second semiconductor device 34B and bonding pads 31 formed on the upper face of the circuit board 32, by bonding wires 40 such as gold wires; and then performing resin molding to seal the semiconductor devices 34A, 34B and the bonding wires 40. The reference numeral 41 denotes a molding resin.

The flip-chip bonding, the wire bonding, and the resin molding are performed by known methods, and hence detailed descriptions thereof will be omitted.

As shown in FIG. 2A, external connection terminals 38 which are used for connecting between the lower package 20 and the upper package 30, and each of which is configured by a solder ball or the like are formed on the lower face (the face which is to be mounted on the upper package 30) of the circuit board 32. The external connection terminals 38 are disposed so as to be opposed to the connection pads 26 and different-shape pads 27 which are disposed on the lower package 20, respectively.

The upper package 30 shown in FIG. 2A employs the structure which uses both the flip-chip bonding and the wire bonding is employed as the structure of stacking semiconductor devices. It is a matter of course that, when the second semiconductor device 34B is to be stacked on the first semiconductor device 34A, a stack form in which both the semiconductor devices 34A, 34B are connected by wire bonding, or that in which both the semiconductor devices 34A, 34B are connected by flip-chip bonding can be employed.

Next, a package joining method of stackingly joining the upper package 30 on the lower package 20 will be described.

First, a grip portion of a conveying apparatus takes out the lower package 20 from a lower-package accommodating portion. The appearance state of the bottom face (lower face) of the taken-out lower package 20 is imaged by a camera, and a control portion applies an image data process on the obtained image to check the appearance state such as the arrangement state of the external connection terminals 28 of the lower package 20. Referring to image data of a non-defective package which are previously stored, and the tolerance, the control portion determines whether the lower package 20 from which the image data are obtained is defective or not defective. The lower package 20 which is determined to be defective by the control portion is conveyed to a defective package accommodating portion (in the embodiment, the original accommodated location in the lower-package accommodating portion). The lower package 20 which is determined to be non-defective by the control portion is set on a carrier in a state where it is oriented in the correct direction.

Next, the grip portion of the conveying apparatus takes out the upper package 30 from an upper-package accommodating portion. Similarly, the appearance state of the bottom face (lower face) of the taken-out upper package 30 is imaged by a camera, and the control portion applies the image data process on the obtained image to check the appearance state such as the arrangement state of the external connection terminals 38 of the upper package 30. Referring to image data of a non-defective package which are previously stored, and the tolerance, the control portion determines whether the upper package 30 from which the image data are obtained is defective or not defective. The upper package 30 which is determined to be defective by the control portion is conveyed to a defective package accommodating portion (in the embodiment, the original accommodated location in the upper-package accommodating portion). The upper package 30 which is determined to be non-defective by the control portion undergoes a process of transferring flux which is not shown to the external connection terminals 38, and then waits at a waiting position.

Then, the surface (upper face) of the lower package 20 which is set on the carrier is imaged by a camera disposed at fixed point, and the control portion applies an image data process on the obtained image to calculate position data of the lower package 20 which is set on the carrier, from the positions of the different-shape pads 27. The control portion previously stores reference image data which are obtained in a state where the different-shape pads 27 are set to reference positions. From the difference between the image data of the imaged lower package 20 and the reference image data, it is possible to calculate the deviation amount in a horizontal plane and rotation angle of the lower package 20 which is set on the carrier, with respect to the reference position. On the basis of the positional deviation amount data (position data) configured by the deviation amount in a horizontal plane and rotation angle which are calculated in this way, the control portion controls the operation of the grip portion of the conveying apparatus so that the upper package 30 which is held by the grip portion itself approaches from the waiting position to the lower package 20 which is set on the carrier, and places the upper package on the lower package in a state where the external connection terminals 38 of the upper package 30 are positioned to the connection pads 26 and the different-shape pads 27, respectively.

In the data process of the image data of the image which is obtained by imaging the surface of the lower package 20, in the case where the connection pads 26 are detected at positions where the different-shape pads 27 are to be detected, it means that the direction of the lower package 20 which is set on the carrier is rotated by 180 degrees. In this case, the control portion stops the operation of the grip portion of the conveying apparatus so that the upper package 30 is not mounted on the lower package 20. If required, the control portion issues an error message.

When the upper package 30 is placed on the lower package 20 which is set on the carrier while positioned thereto, conveying means conveys the carrier to a reflow oven. In the reflow oven, the solder balls constituting the external connection terminals 38 flow, and the lower package 20 and the upper package 30 are joined to each other in the portions of the connection pads 26 and the different-shape pads 27, thereby obtaining the semiconductor package 10 of the POP structure shown in FIG. 3.

In the embodiment, two of the connection pads 26 disposed in the lower package 20 are changed in shape to form the different-shape pads 27, 27, and the different-shape pads 27, 27 are disposed at the positions which are asymmetric about the center point of the lower package 20. When the different-shape pads 27 are used as an alignment mark, therefore, it is enabled to surely determine whether the lower package 20 is rotated by 180 degrees in the package plane or not, simply by checking the positions of the two different-shape pads 27. Consequently, the time period required for checking the mounting state of the lower package 20 on the carrier can be shortened, and hence the semiconductor package 10 of the POP structure can be produced surely and efficiently.

Second Embodiment

Figure 4:
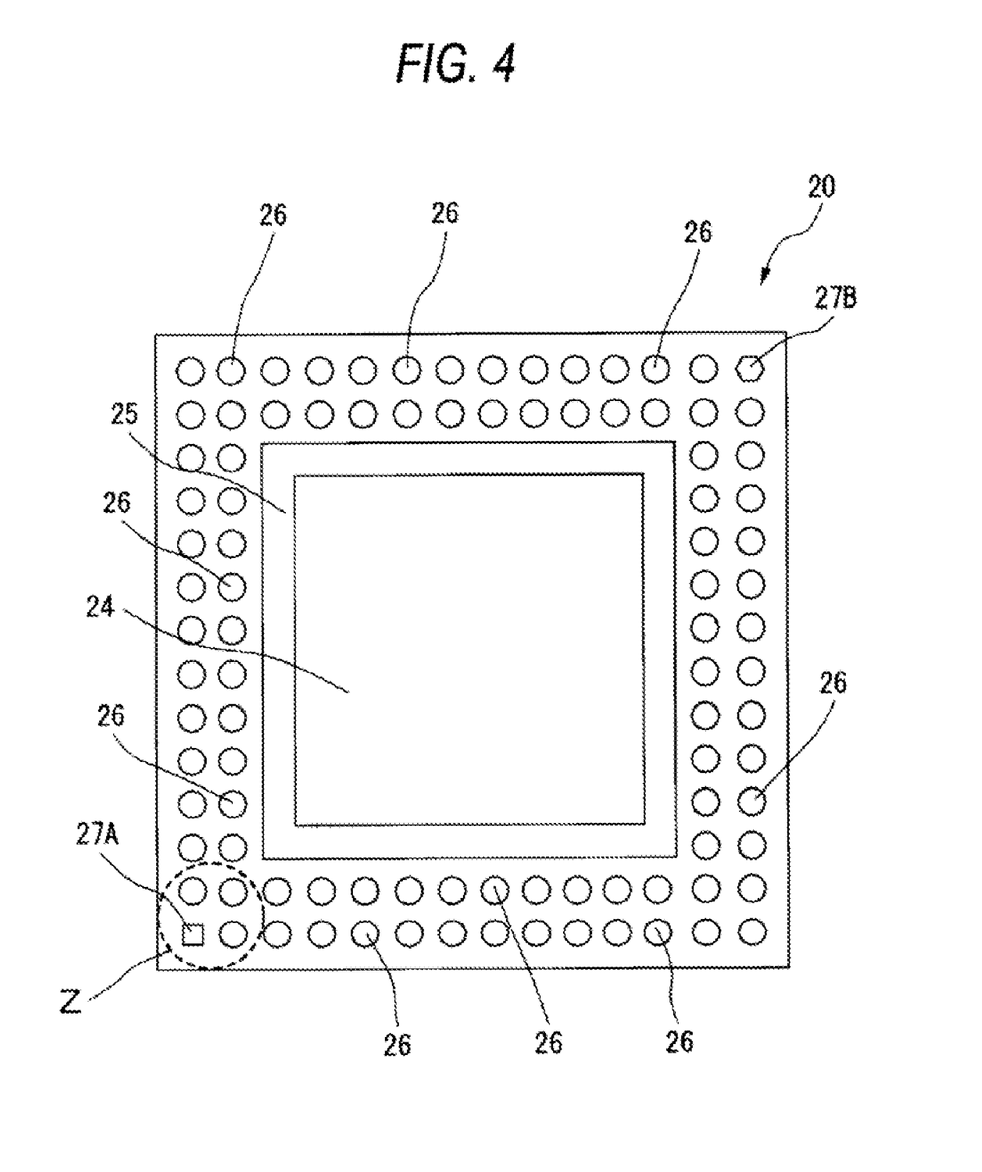
FIG. 4 is a plan view showing a lower package in a second embodiment.

An embodiment in which similar effects as those in the above-described embodiment can be attained even when different-shape pads 27A, 27B are disposed on a planar diagonal line of a package, i.e., at usual positions of alignment marks will be described.

FIG. 4 is a plan view showing the lower package in the second embodiment.

The embodiment is characterized in that the two different-shape pads 27A, 27B disposed in the lower package 20 are formed into different shapes. In the embodiment, the one different-shape pad 27A is formed into a rectangular shape, and the other different-shape pad 27B is formed into a hexagonal shape. In the configuration where the different-shape pads 27A, 27B themselves have the shapes which are different from each other as described above, even when the different-shape pads 27A, 27B are respectively disposed in point-symmetrical positions about the plane center point of the lower package 20, it is enabled to determine whether the lower package 20 is rotated by 180 degrees in the package plane or not, simply by checking the two different-shape pads 27A, 27B.

Specifically, in a similar manner as the above-described embodiment, the appearance states of the lower package 20 and the upper package 30 are imaged by a camera, and the appearance states of the packages are checked. Thereafter, the surface (upper face) of the lower package 20 which is mounted on the carrier is imaged by a camera. By using image data of the obtained image, and those which are previously stored in the control portion, and which are obtained from the surface of the lower package 20 that is mounted on the carrier in the normal state, possible differences of the image data of the portions of the different-shape pads 27A, 27B are observed.

Figure 5A:
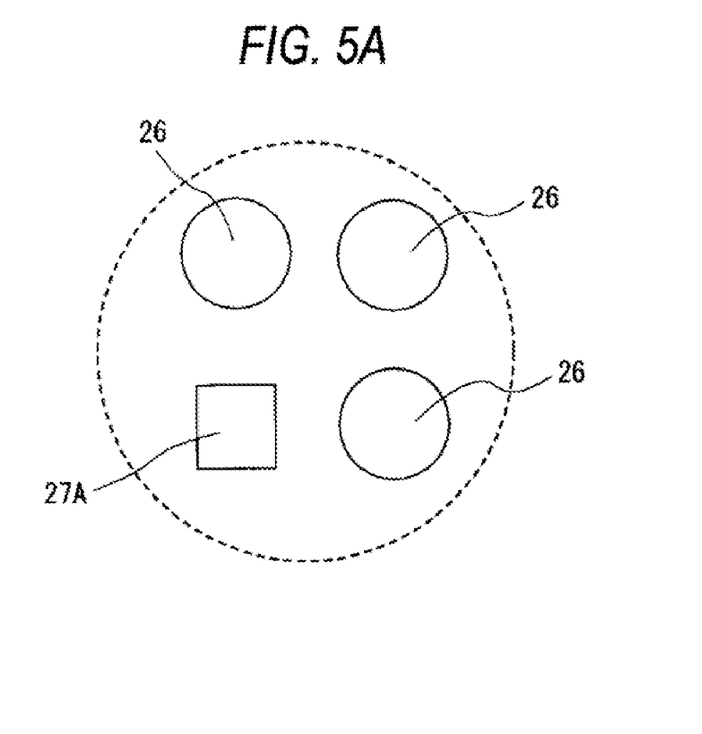
FIGS. 5A and 5B are plan views showing images which are obtained by imaging portions of different-shape pads in the second embodiment.
Figure 5B:
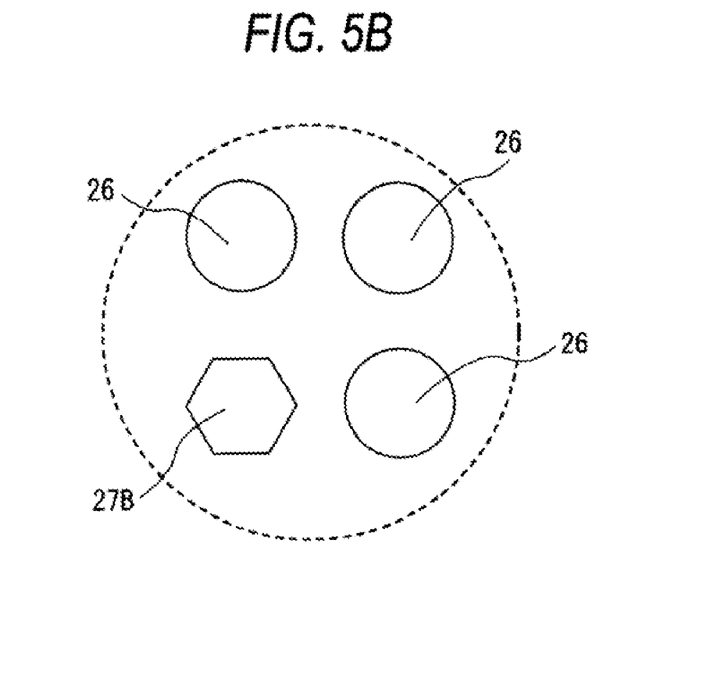

When the direction of the lower package 20 mounted on the carrier is correct, image data of the portion (the portion Z in FIG. 4) where the different-shape pad 27A is disposed are as shown in FIG. 5A. By contrast, when the direction of the lower package 20 mounted on the carrier is rotated by 180 degrees in the package plane, the image data are as shown in FIG. 5B. In this way, the outline patterns of the image data of the disposed position of the different-shape pad 27A are obviously different.

Therefore, it is easily determined that the direction of the lower package 20 mounted on the carrier is defective. Even in the case where, when the disposed positions of the different-shape pads 27A, 27B are rotated by 180 degrees about the center point of the lower package 20, the positions of the center points of the different-shape pads 27A, 27B coincide with each other, the determination is enabled by differentiating the outline of the different-shape pads 27A from that of the different-shape pads 27B.

Also in the case where the different-shape pad 27B is used as the reference, when a similar determination method is performed, it is possible to determine whether a 180-degree rotation in a horizontal plane of the lower package 20 has occurred or not.

After the occurrence/non-occurrence of a 180-degree rotation in a horizontal plane of the lower package 20 is determined, the different-shape pads 27A, 27B are used as an alignment mark, and a similar method as the first embodiment is performed, whereby the positional deviation amount data (position data) configured by the deviation amount in a horizontal plane and rotation angle of the lower package 20 can be calculated. The subsequent processes are identical with those of the first embodiment, and hence their detailed description is omitted in the description of the present embodiment.

Also in the embodiment, simply when the two different-shape pads 27A, 27B on the surface of the lower package 20 are observed, it is possible to determine whether the direction of the lower package 20 mounted on the carrier is correct or not, and calculate the positional deviation amount data (position data) with respect to the reference position and configured by the deviation amount in a horizontal plane and rotation angle of the lower package 20, whereby similar effects as those in the first embodiment can be attained.

Third Embodiment

Figure 6:
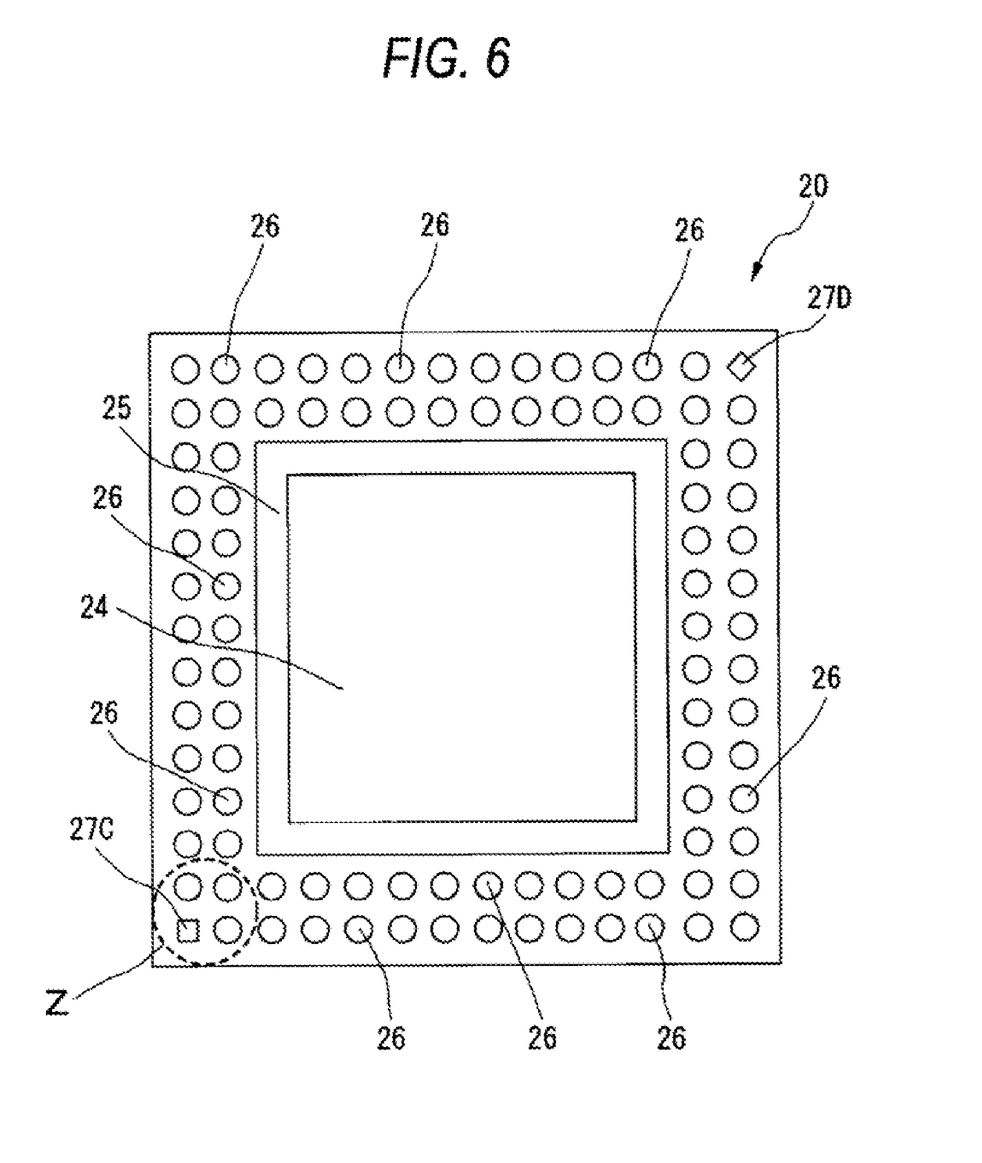
FIG. 6 is a plan view showing a semiconductor package in a third embodiment.

FIG. 6 is a plan view showing the semiconductor package of a third embodiment. The third embodiment is a modification of the second embodiment.

The embodiment is identical with the second embodiment in that two different-shape pads 27C, 27D are disposed on a planar diagonal line of the lower package 20, but different therefrom in that the shapes of the different-shape pads 27C, 27D are identical with each other. Namely, with respect to the disposition state of the one different-shape pad 27C, the other different-shape pad 27D is disposed while being rotated by a predetermined angle in the plane of the lower package 20 (in the state where the orientation directions of the different-shape pads 27C, 27D are different for each other). In the embodiment, with respect to the disposition state of the one different-shape pad 27C, the other different-shape pad 27D is disposed in a state where it is rotated by 45 degrees about the center point of the different-shape pads 27C.

Figure 7A:
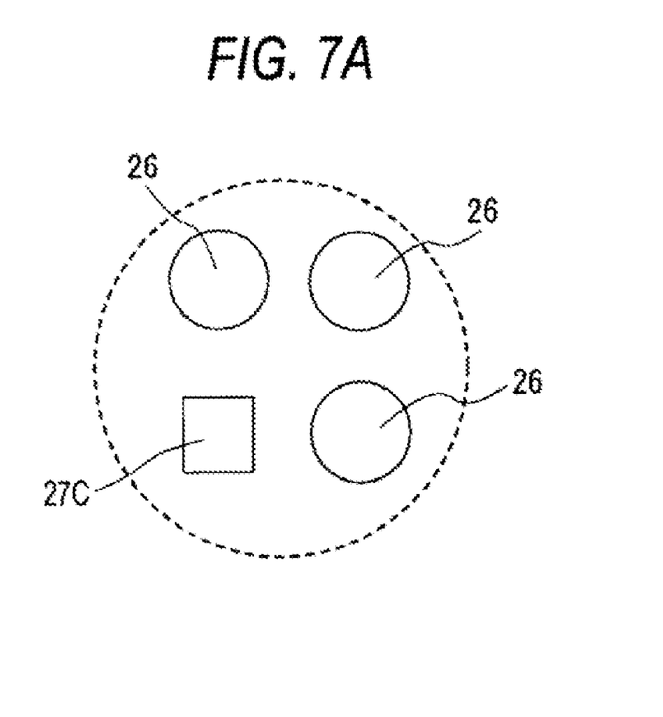
FIGS. 7A and 7B are plan views showing images which are obtained by imaging two different-shape pads disposed in a disposition range of connection pads.
Figure 7B:
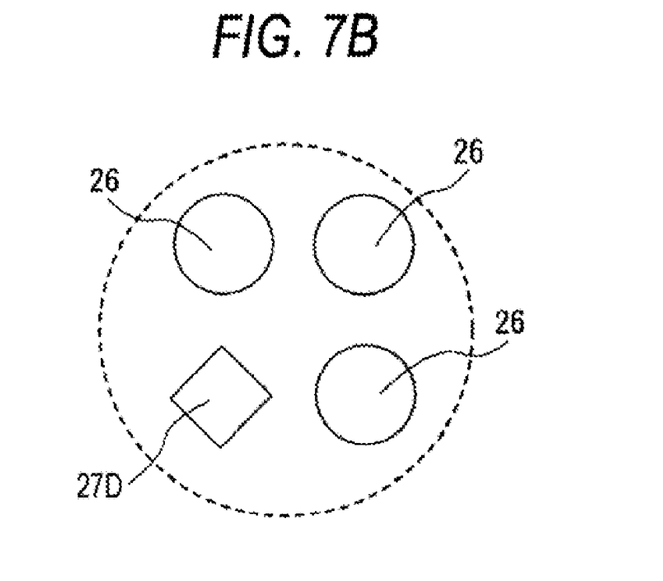

FIGS. 7A and 7A are enlarged plan views of the portion Z in FIG. 6, FIG. 7A shows an image which is taken in a state where the lower package is mounted on the carrier in the normal state, and FIG. 7B shows an image which is taken in a state where the lower package is rotated by 180 degrees in a horizontal plane.

With respect to each of the different-shape pads 27C, 27D disposed in the lower package 20, the control portion previously stores reference image data which are obtained by imaging in a state where the lower package 20 is set on the carrier in the normal state. When image data of the different-shape pad 27C or 27D which are obtained by actual imaging by a camera are compared with the reference image data, therefore, it is possible to easily determine whether the disposition state of the lower package 20 on the carrier (the occurrence/non-occurrence of a 180-degree rotation in a horizontal plane and the positional deviation amount in the X-Y direction in the horizontal plane) is correct or not.

This method can be applied to any shape of the different-shape pad other than a shape (circular shape) in which the outline of a different-shape pad is defined only by an equal distance from the center point of the different-shape pad.

The subsequent processes are identical with those of the first and second embodiments, and hence their detailed description is omitted.

Although the invention has been described with reference to the embodiments, the invention is not restricted to the above-described embodiments, and it is a matter of course that even other embodiments belong to the technical scope of the present invention.

Figure 8:
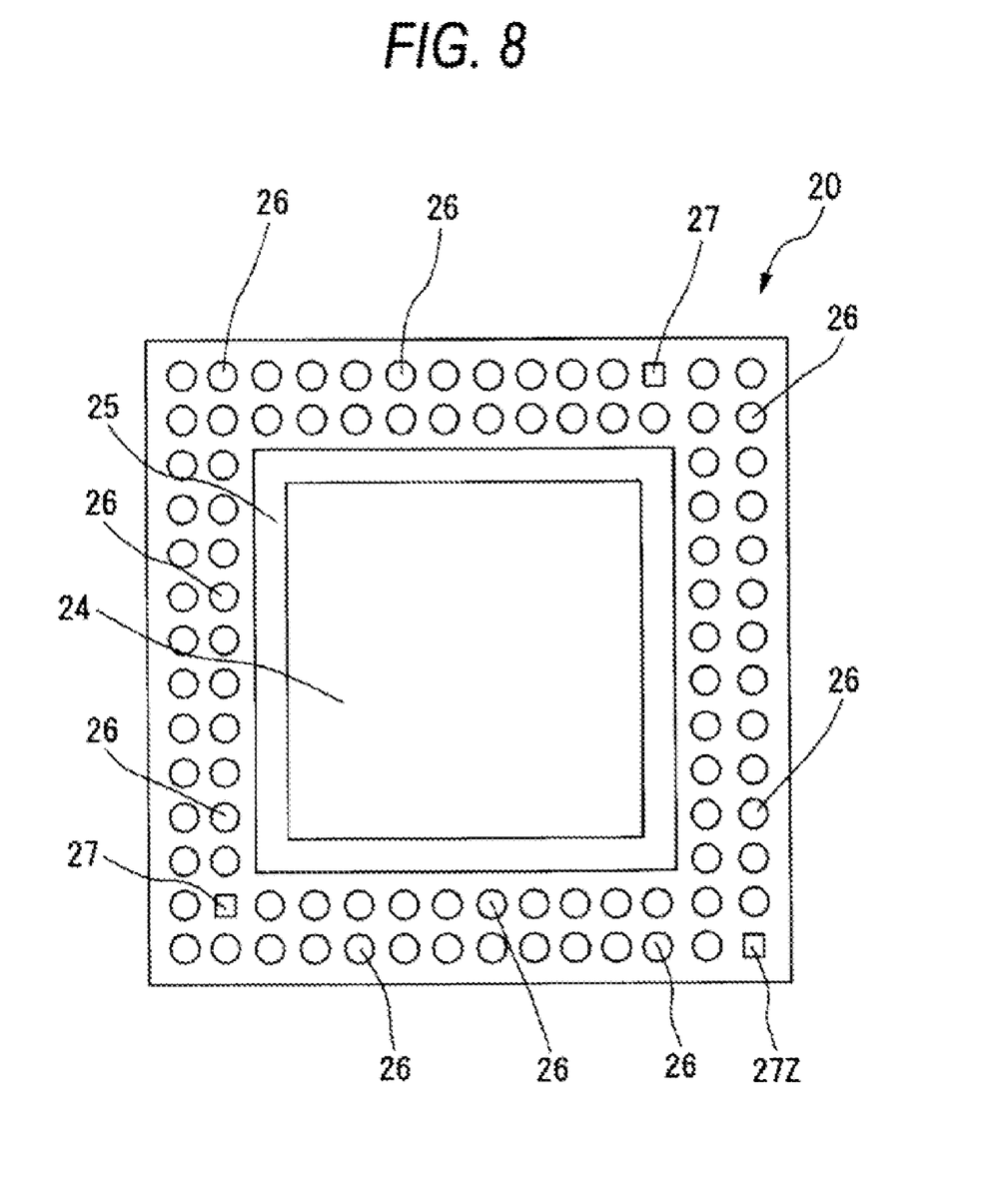
FIG. 8 is a plan view of the lower package showing an example of another embodiment.

In the above-described embodiments, two of the connection pads 26 of the lower package 20 are formed into the differen-shape pads 27, peripheral portions respectively including the different-shape pads 27 are imaged by a camera, and the control portion compares the image data with the reference image data, thereby enabling the determination of the mounting state of the upper package 30 on the lower package 20, and the calculation of the positional deviation amount data (position data) in the case where the upper package 30 is to be stacked on the lower package 20 by the grip portion of the conveying apparatus. A configuration where, as shown in FIG. 8, a second different-shape pad 27Z for visual check is disposed in the lower package 20 and outside the imaging range of the camera is of course possible. When this configuration is employed, the disposition state of the lower package 20 with respect to the carrier can be doubly checked by the control portion and the operator, and hence the configuration is advantageous.

In the above, the embodiments have been described in which the control portion controls the operation of the grip portion of the conveying apparatus so that the upper package 30 approaches to the lower package 20 by the grip portion of the conveying apparatus, on the basis of the positional deviation amount data (position data) in the package horizontal plane that are obtained from the difference between the image data obtained by imaging the different-shape pads 27 and the reference image data. A configuration is of course possible where the control portion performs a control so that the carrier on which the lower package 20 is set is moved on the basis of the positional deviation amount data, the lower package 20 set on the carrier is positioned to the correct position, and the upper package 30 is simply lowered by the grip portion of the conveying apparatus, thereby stacking the upper package on the lower package 20. In the case where this configuration is employed, preferably, the carrier includes a suction holding mechanism so that the set state of the lower package 20 is not disturbed.

In the above embodiment, the methods of producing the semiconductor package 10 of the POP structure in which the semiconductor package of the invention is used as the lower package 20 have been described. A method of producing the semiconductor package 10 of the POP structure in which the semiconductor package of the invention is applied to the upper package 30 is of course possible.

Figure 9:
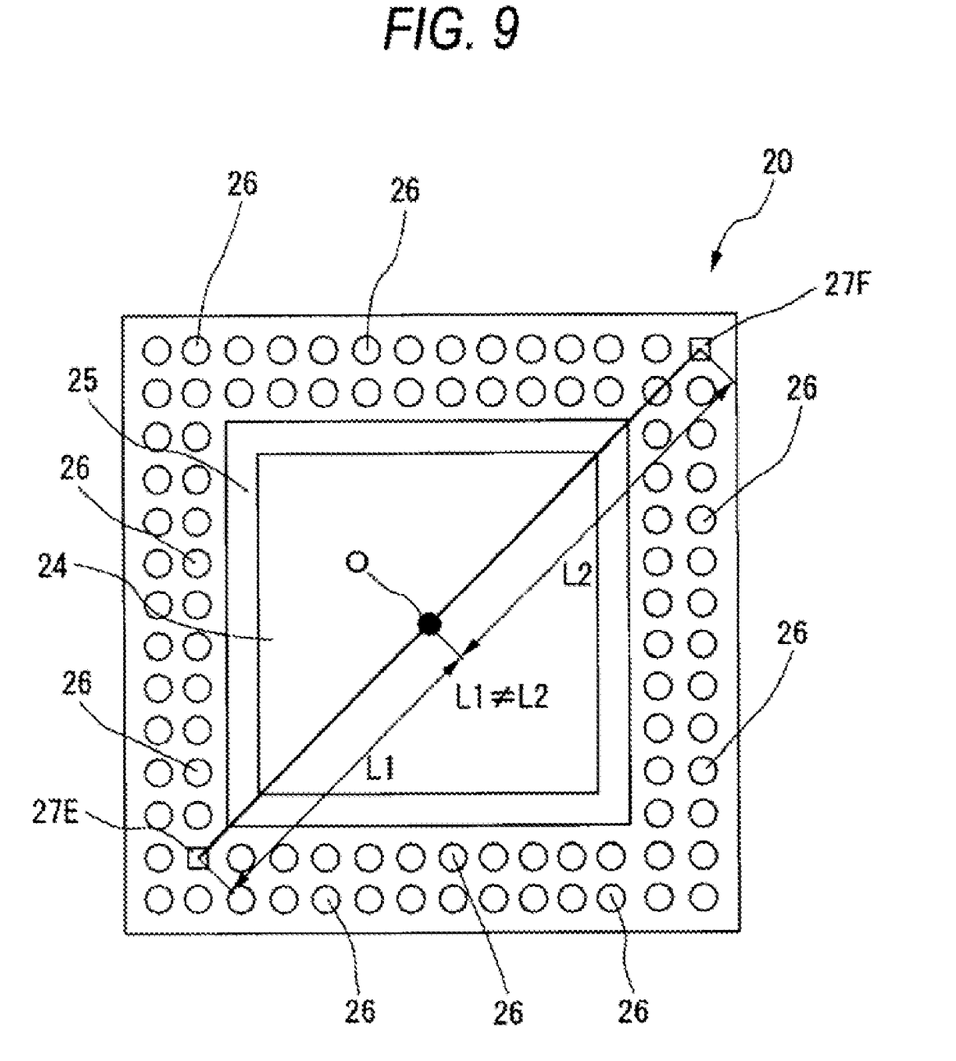
FIG. 9 is a plan view of the lower package showing an example of another embodiment.

In the first embodiment, the configuration has been described where the different-shape pads 27, 27 are disposed so that the line connecting the different-shape pads 27, 27 does not pass the center point of the upper face of the lower package 20. Even in a configuration where, as shown in FIG. 9, a line connecting one different-shape pad 27E and another different-shape pad 27F passes the center point O of the upper face of the lower package 20, in the case where the conditions that the distance L1 between the one different-shape pad 27E and the center point O of the upper face of the lower package 20 is different from the distance L2 between the other different-shape pad 27F and the center point O of the upper face of the lower package 20 are satisfied, it is possible to determine the occurrence/non-occurrence of a 180-degree rotation in a horizontal plane of the lower package 20. When this configuration is employed, the axis-to-axis distance of the different-shape pads 27E, 27F is prolonged, and hence the accuracy of calculation of the positional deviation amount data can be improved. Therefore, the configuration is advantageous.

What is claimed is:

1. A semiconductor package comprising:
    a substrate having a planar surface;
    a semiconductor device mounted to the planar surface; and,
    a plurality of connection pads set in the substrate and disposed so as to surround the semiconductor device, two of said connection pads being formed into different-shape pads and remaining connection pads being formed into a common shape pad, whereby said different-shape pads have a planar shape that is different than a planar shape of said common shape pad,
    wherein a first of said different-shape pads and a second of said different-shape pads are disposed in a manner that, in a mutual positional relationship of a planar arrangement, when a position of said first different-shape pad is rotated by 180 degrees about a center point of said semiconductor package, the position does not completely coincide with an initial position of said second different-shape pad.

2. The semiconductor package according to claim 1, wherein
    said first different-shape pad and said second different-shape pad are disposed in a manner that, when the position of said first different-shape pad is rotated by 180 degrees about the center point of said semiconductor package, a position of a center point of said first different-shape pad is displaced from a position of a center point of said second different-shape pad.

3. The semiconductor package according to claim 1, wherein the connection pads are co-planar with each other and with the substrate.

4. A semiconductor package comprising:
    a substrate having a planar surface;
    a semiconductor device mounted to the planar surface; and,
    a plurality of connection pads set in the substrate and disposed so as to surround the semiconductor device, two of said connection pads being formed into different-shape pads and remaining connection pads being formed into a common shape pad, whereby said different-shape pads have a planar shape that is different than a planar shape of said common shape pad,
    wherein
    said first different-shape pad and said second different-shape pad are disposed in a manner that, when the position of said first different-shape pad is rotated by 180 degrees about the center point of said semiconductor package, a position of a center point of said first different-shape pad coincides with a position of a center point of said second different-shape pad, and an outline of said first different-shape pad is different from an outline of said second different-shape pad.

5. The semiconductor package according to claim 4, wherein the connection pads are co-planar with each other and with the substrate.

6. A stacked semiconductor package assembly comprising an upper and a lower semiconductor package, said upper semiconductor package being adapted to be mounted over said lower semiconductor package, said lower semiconductor package including:
    a substrate having a planar surface;
    a semiconductor device mounted to the planar surface; and,
    a plurality of connection pads set in the substrate and disposed so as to surround the semiconductor device, at least two of said connection pads being formed into different-shape pads while remaining connection pads are formed into a common shape pad, said different-shape pads having a planar shape that is different than a planar shape of said common shape pad,
    wherein a first of said different-shape pads and second of said different-shape pads are disposed in a manner that, in a mutual positional relationship of a planar arrangement, when a position of said first different-shape pad is rotated by 180 degrees about a center point of said semiconductor package, the position does not completely coincide with an initial position of said second different-shape pad; and,
    wherein visual inspection of the different-shape pads on the lower semiconductor package readily allows the lower semiconductor package to be properly oriented.

7. The semiconductor package according to claim 6, wherein the connection pads are co-planar with each other and with the substrate.

* * * * *